US008406002B2

(12) United States Patent
Tsai et al.

(10) Patent No.: US 8,406,002 B2
(45) Date of Patent: Mar. 26, 2013

(54) LOW NOISE BLOCK DOWN-CONVERTER WITH INTEGRATED FEED

(75) Inventors: Wen-Tsai Tsai, Hsinchu (TW); Tsan-Chou Wu, Hsinchu (TW); Ta-Jen Wu, Hsinchu (TW)

(73) Assignee: Wistron NeWeb Corporation, Hsinchu Science Park, Hsinchu (TW)

( * ) Notice: Subject to any disclaimer, the term of this patent is extended or adjusted under 35 U.S.C. 154(b) by 270 days.

(21) Appl. No.: 12/876,175

(22) Filed: Sep. 6, 2010

(65) Prior Publication Data

US 2011/0310570 A1 Dec. 22, 2011

(30) Foreign Application Priority Data

Jun. 21, 2010 (TW) ................................ 99120116 A

(51) Int. Cl.
*H05K 5/00* (2006.01)

(52) U.S. Cl. ........................................................ 361/752

(58) Field of Classification Search .................. 361/752, 361/679.01, 728, 737; 174/351, 378, 527; 439/492, 541.5, 555, 607.4, 695, 885
See application file for complete search history.

*Primary Examiner* — Jeremy Norris
*Assistant Examiner* — Tremesha S Willis
(74) *Attorney, Agent, or Firm* — Winston Hsu; Scott Margo

(57) ABSTRACT

An LNBF is disclosed. The LNBF includes a housing, a spacer, down-converter circuit, and an F-connector. The spacer is disposed on the housing, wherein a hole is formed on the spacer. The down-converter circuit board is disposed between the housing and the spacer. The F-connector is disposed on the spacer and electrically connected to the down-converter circuit board via the hole.

11 Claims, 8 Drawing Sheets

LOW NOISE BLOCK DOWN-CONVERTER WITH INTEGRATED FEED

BACKGROUND OF THE INVENTION

1. Field of the Invention

The invention relates to a low noise block down-converter with integrated feed (LNBF), and more particularly, to an LNBF capable of realizing a miniaturized design.

2. Description of the Prior Art

Satellite communication technology has advantages of wide coverage area and long distance linking, and is applied in many domains, such as in satellite broadcasting or communication systems. Thus, wherever you are (even on the ocean or in the desert), a satellite signal may be received by a corresponding antenna. A low noise block down-converter with integrated feed (LNBF) is an essential component for receiving the satellite signal. In general, the LNBF can down-convert and amplify the received satellite signal, and further transmit the processed satellite signal to a satellite receiver box via coaxial cable for further processing.

Please refer to FIG. 1, which is an exploded diagram of an LNBF 10 according to the prior art. The LNBF 10 includes a housing 102, a down-converter circuit board 104, a spacer 106, and an F-connector 108. The down-converter circuit board 104 is electrically connected to the F-connector 108 so that the down-converter circuit board 104 can be connected to a coaxial cable via the F-connector 108 for transmitting satellite signals to a satellite receiver. As shown in FIG. 1, the down-converter circuit board 104 is disposed on a first side of the housing 102, and the spacer 106 is disposed on the down-converter circuit board 104. Generally, the housing 102, the down-converter circuit board 104, and the spacer 106 can be assembled together in a lockup fastening manner, and the F-connector 108 can be fastened to a second side of the housing 102 . Moreover, in the assembly process, the down-converter circuit board 104 can be fixed on the housing 102 in advance and furthermore, the spacer 106 can also be fixed on the housing 102. Finally, the F-connector 108 can be fixed on the second side of the housing 102. In other words, the relationship of the components of the LNBF 10 (i.e. the component order) is as follows: the spacer 106, the down-converter circuit board 104, the housing 102, and the F-connector 108.

Regarding trends of miniaturization and lower cost of electronic products, product manufacturers try their best to minimize product size during product design. For example, during product design, layout area of a down-conversion circuit can be shrunk by using specific circuit layout techniques and then, board area of the down-converter circuit board 104 is reduced accordingly to achieve miniaturization and lower cost. However, in the LNBF 10, even though the board size of the down-converter circuit board 104 can be reduced through the circuit layout techniques, size of the housing 102 cannot be minimized due to overall component completeness. Please refer to FIG. 2, which is a side-view diagram of the LNBF 10 according to the prior art. In an area A in FIG. 2, it is necessary to reserve a space between the surrounding structure of the housing 102 and the F-connector 108 for convenient assembly so that assembly interference caused by the housing 102 will not occur when the coaxial cable is assembled with the F-connector 108. In such a situation, even if the board size of the down-converter circuit board 104 can be reduced through the circuit layout techniques, the size of the housing 102 cannot be minimized due to the above-mentioned structure. In short, how to reduce the size of the LNBF 10 without causing any assembly interference should be a concern in improving application design.

SUMMARY OF THE INVENTION

It is therefore a primary objective of the claimed invention to provide a low noise block down-converter (LNBF).

An embodiment of the invention discloses an LNBF, which includes a housing, a spacer disposed on the housing, wherein a hole is formed on the spacer, a down-converter circuit board disposed between the housing and the spacer, and an F-connector disposed on the spacer and electrically connected to the down-converter circuit board via the hole.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
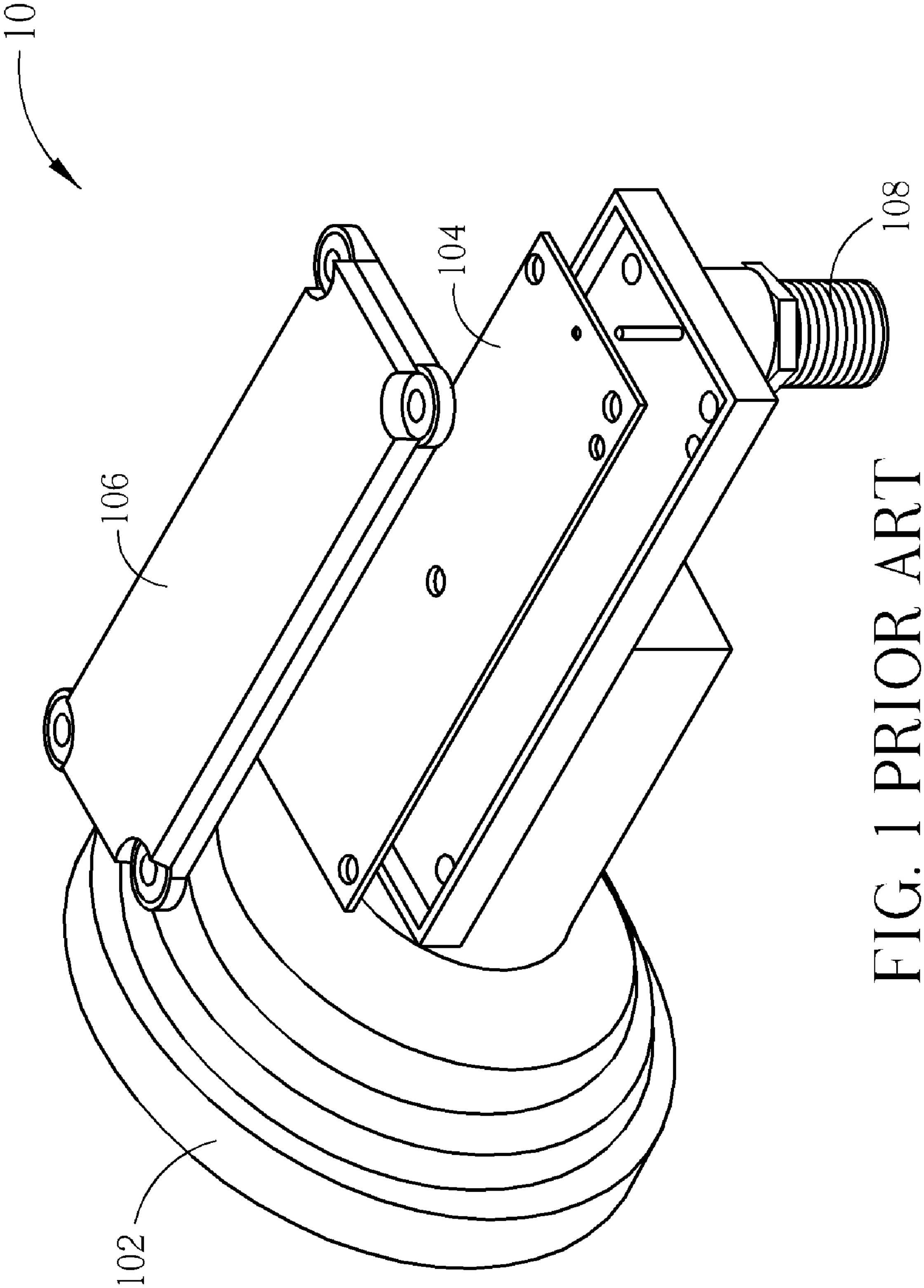
FIG. 1 PRIOR ART
FIG. 1 is an exploded diagram of an LNBF according to the prior art.
Figure 2:
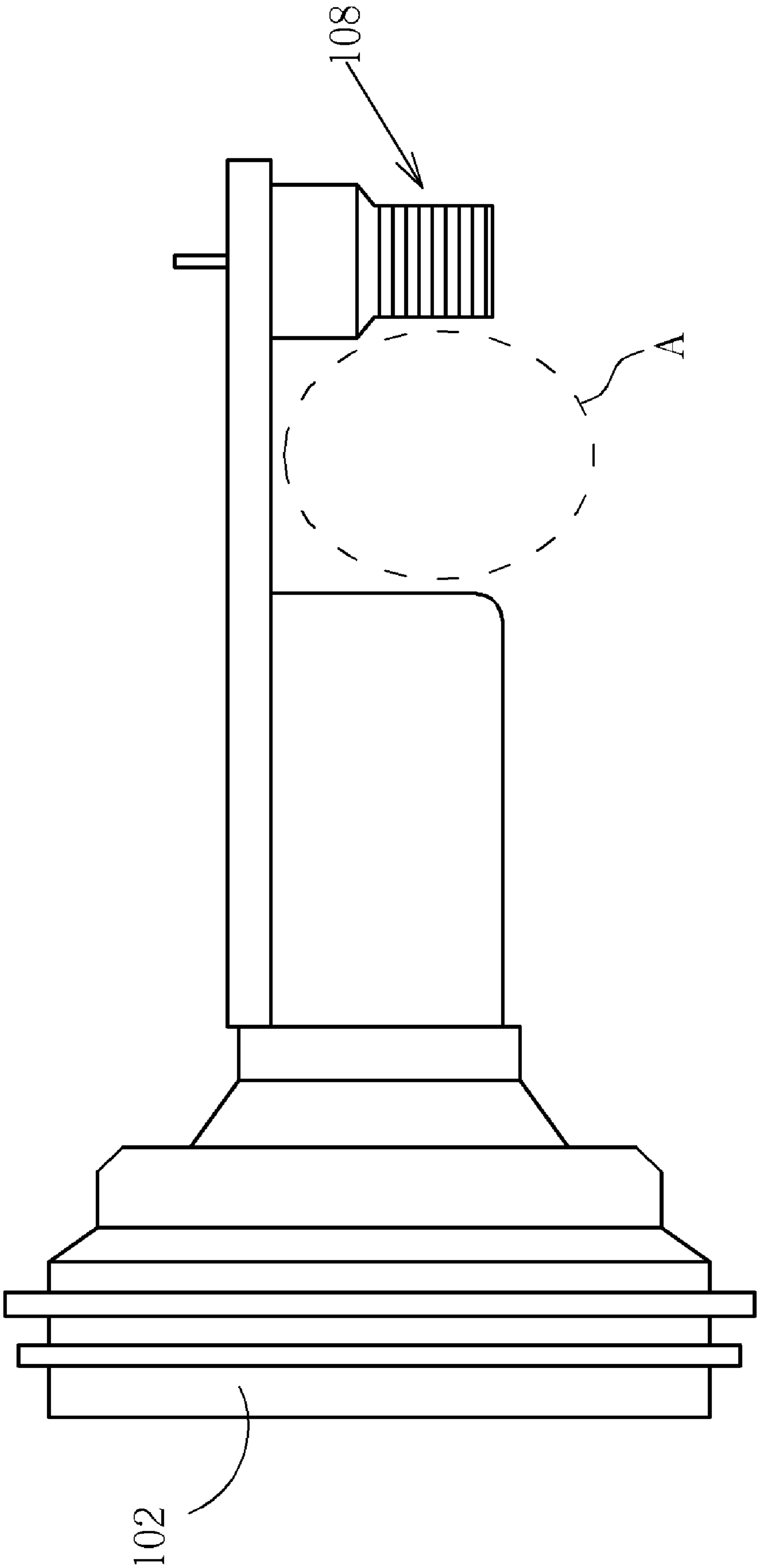
FIG. 2 PRIOR ART
FIG. 2 is a side-view diagram of the LNBF according to the prior art.
Figure 3:
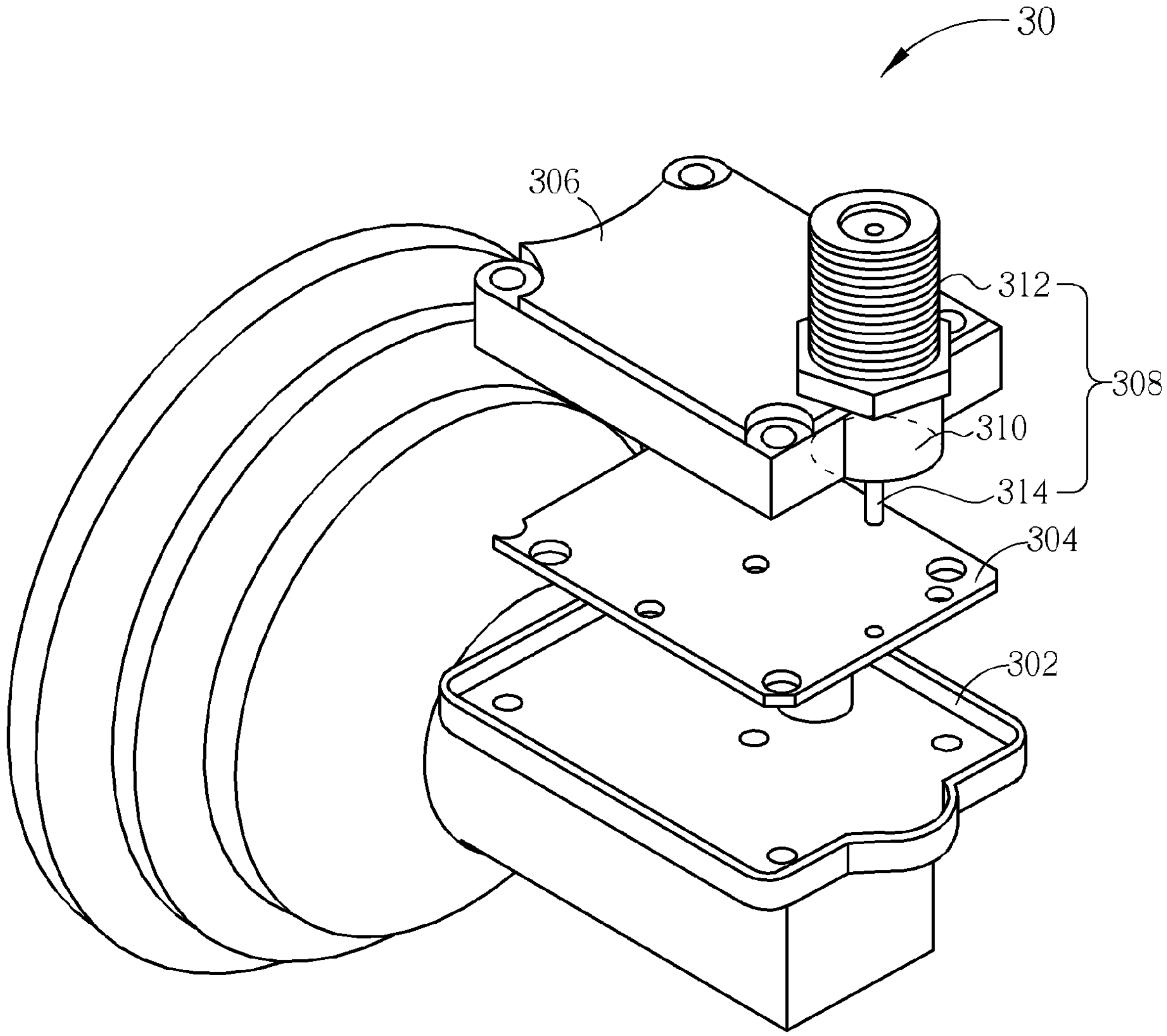
FIG. 3 is an exploded diagram of an LNBF according to the invention.
Figure 4:
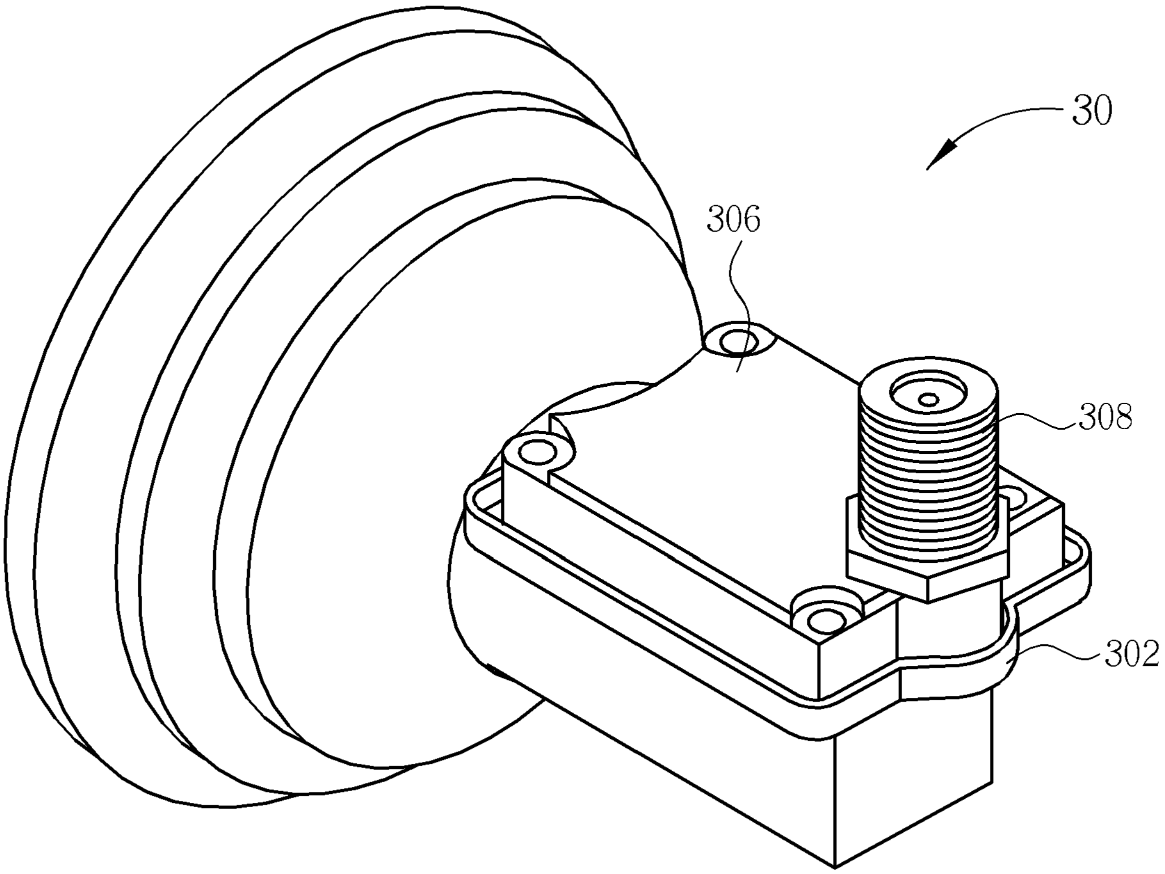
FIG. 4 is a schematic diagram of an assembly structure of the LNBF according to the invention.

Please refer to FIG. 3 and FIG. 4. FIG. 3 is an exploded diagram of an LNBF 30 according to the invention. FIG. 4 is a schematic diagram of an assembly structure of the LNBF 30 according to the invention. The LNBF 30 includes a housing 302, a down-converter circuit board 304, a spacer 306, and an F-connector 308. The spacer 306 is disposed on the housing 302, and a hole 310 is formed on the spacer 306. The down-converter circuit board 304 is disposed between the housing 302 and the spacer 306. The F-connector 308 is disposed on the spacer 306 and electrically connected to the down-converter circuit board 304 via the hole 310.

As shown in FIG. 3, the F-connector 308 is disposed on the spacer 306 and electrically connected to the down-converter circuit board 306 via the hole 310. Compared with the prior art, the F-connector 308 is set on the spacer 306. Moreover, unlike the housing 302 having thick and strong shape, the spacer 306 need not reserve an operation space for the F-connector 308 to assemble with coaxial cables. As a result, as the board size of the down-converter circuit board 304 is reduced through the circuit layout techniques, the size of the housing 302 and the spacer 306 can also be minimized accordingly.

Therefore, as the F-connector 308 is integrated onto the spacer 306, the size of each component of the LNBF 30 is capable of being reduced with the minimized sized of the down-converter circuit board 304, reducing size of the LNBF 30 effectively. The manufacturing material can be simplified as well, and the manufacturing cost is able to be reduced substantially.

Figure 5A:
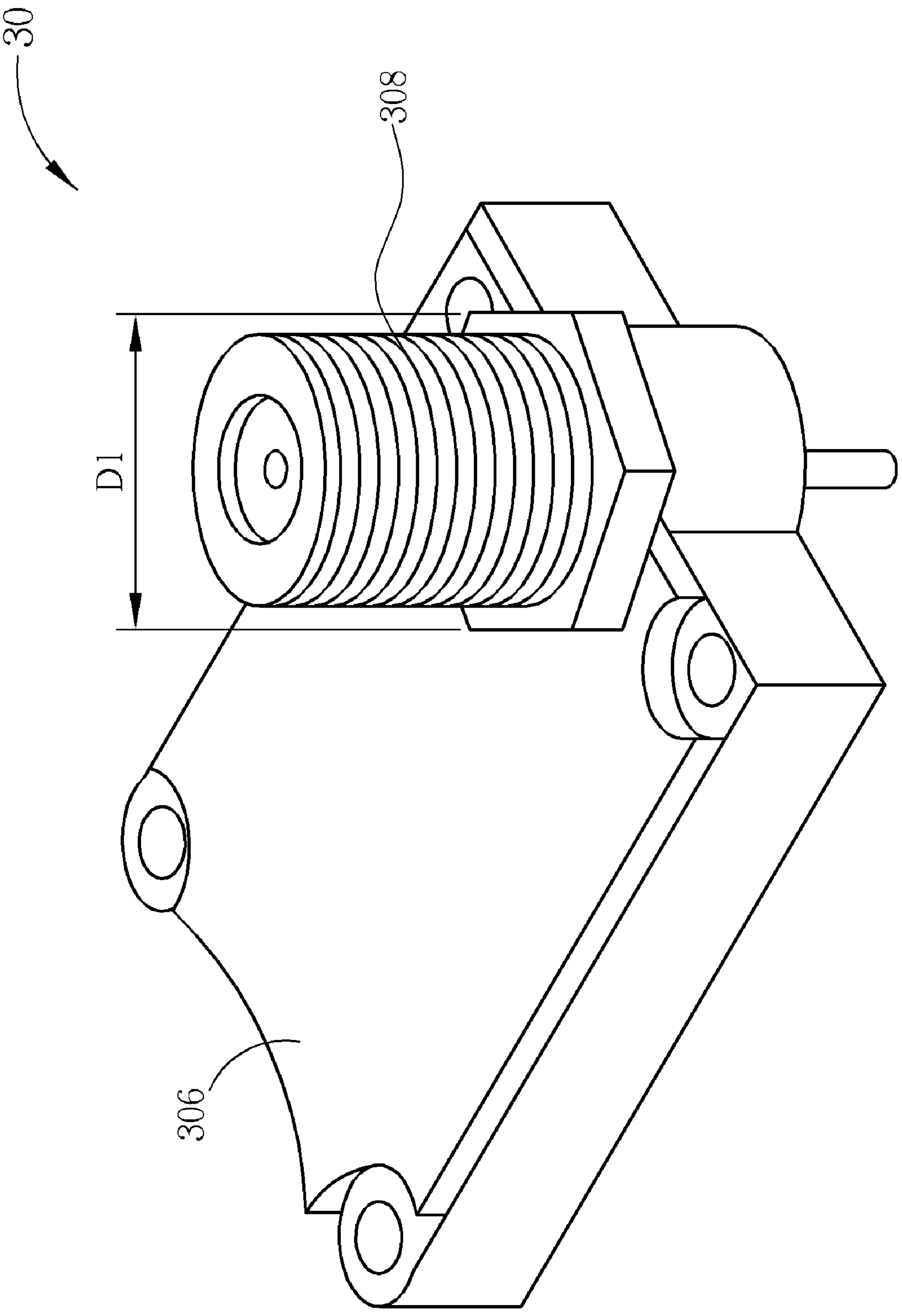
FIGS. 5A and 5B are schematic diagrams of the spacer combining with the F-connector according to the invention.
Figure 5B:
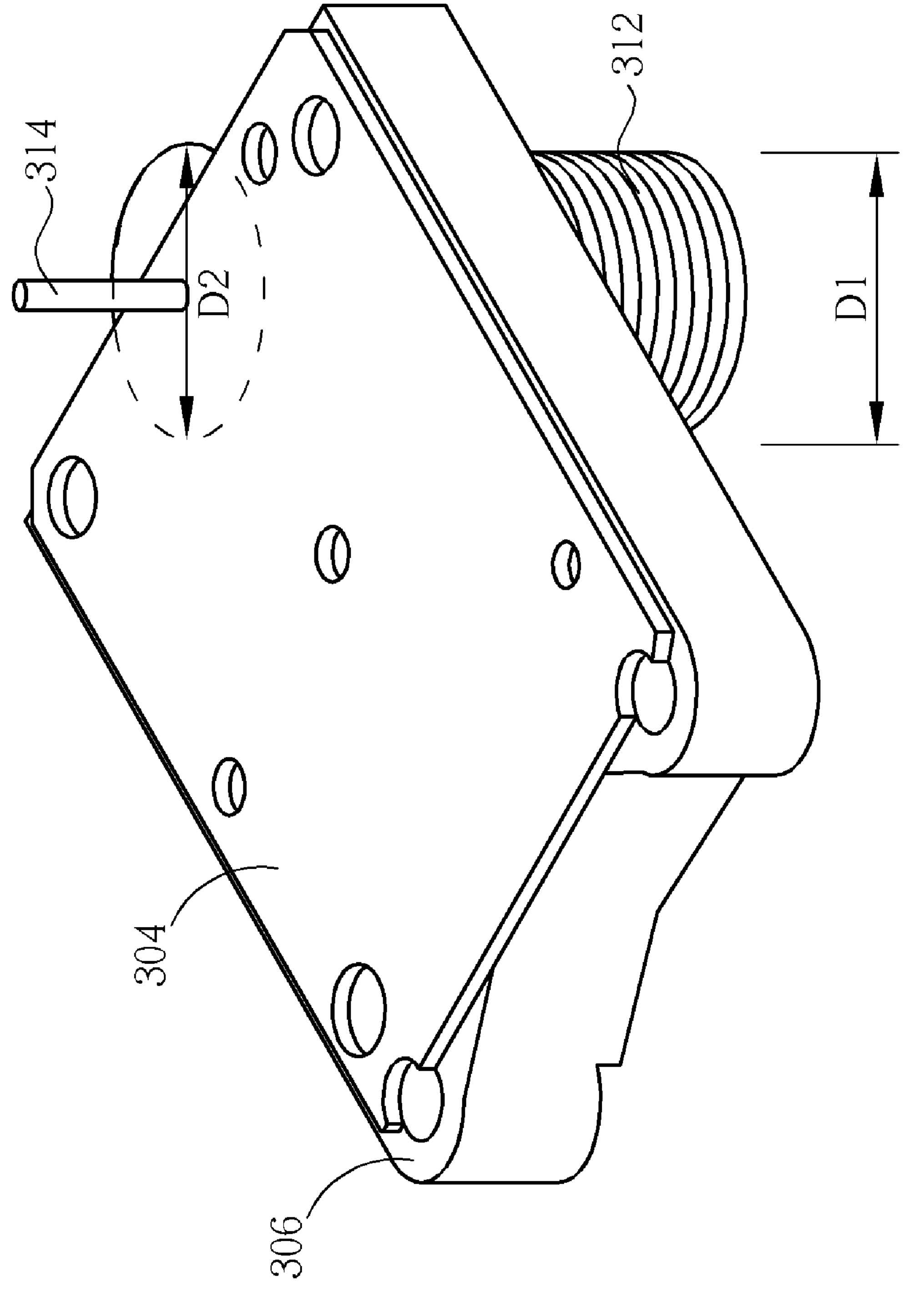

Furthermore, please refer to FIGS. 3, 5A, and 5B. FIGS. 5A and 5B are schematic diagrams of the spacer 306 combined with the F-connector 308 according to the invention. The F-connector 308 includes a connector body 312 and a conducting line 314. The connector body 312 is fixed on the spacer 306. The conducting line 314 is electrically connected to the down-converter circuit board 304 through the hole 310 for transmitting signal. Preferably, the connector body 312 has a diameter D1 larger than a diameter D2 of the hole 310 of the spacer 306. As a result, the connector body 312 can be disposed on the spacer 306 and also arranged around the hole 310, and the conducting line 314 is able to connect with the down-converter circuit board 314 via the hole 310.

Figure 6:
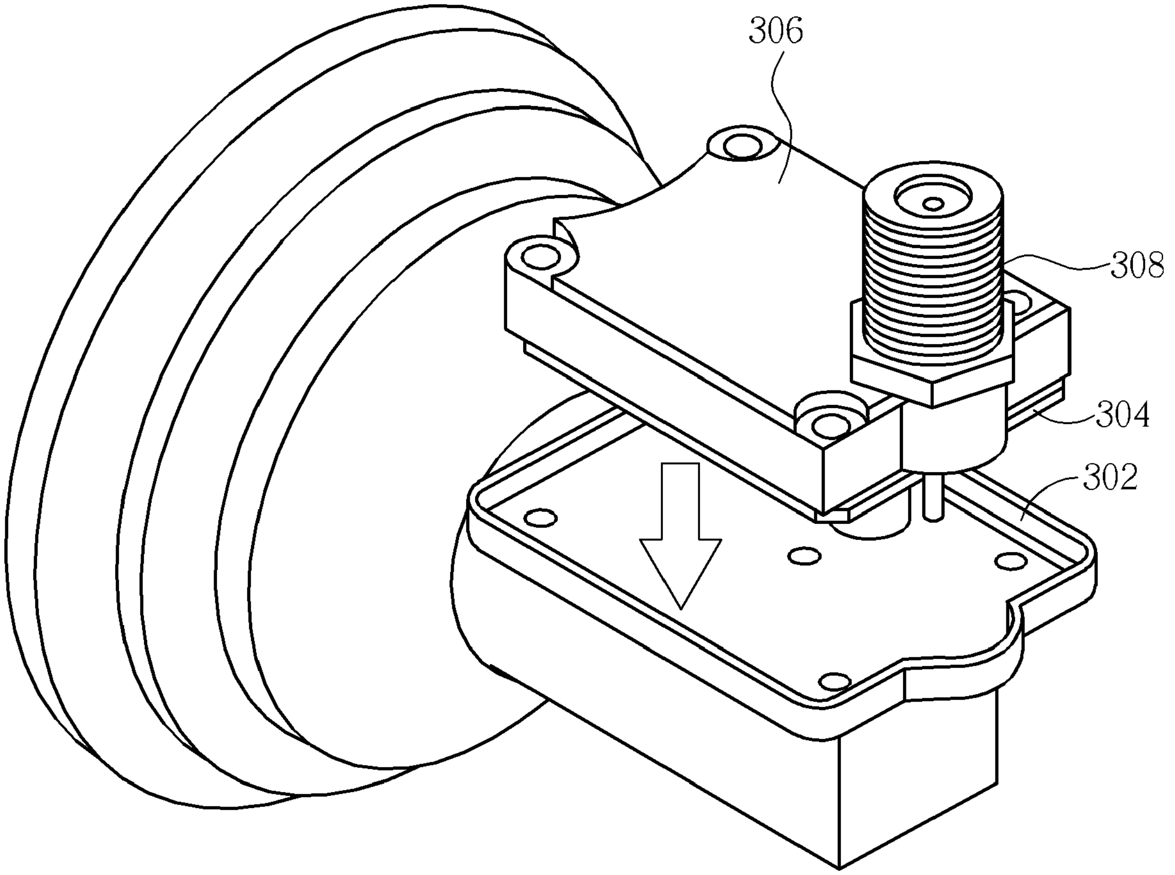
FIG. 6 is a schematic diagram of the LNBF during the assembly process according to an embodiment of the invention.

In addition, regarding an assembly process of the LNBF 30, please refer to FIG. 6, which is a schematic diagram of the LNBF 30 during the assembly process according to an embodiment of the invention. As shown in FIG. 6, first, the down-converter circuit board 304 and the F-connector 308 are respectively on both sides of the spacer 306. During the assembly process, the conducting line 314 has to contact exactly with the down-converter circuit board 304. Therefore, signals from the down-converter circuit board 304 can be transmitted to the coaxial cables through the conducting line 314, and then forwarded to a satellite receiver box for further processing. After that, the assembly item of the down-converter circuit board 304, the spacer 306, and the F-connector 308 can be installed on the housing 302. The assembly method shown in FIG. 6 has an advantage that the conducting line 314 of the F-connector 308 can be easily connected with the down-converter circuit board 304 without undergoing a difficult alignment operation before the down-converter circuit board 304 has been disposed on the housing 302.

Figure 7:
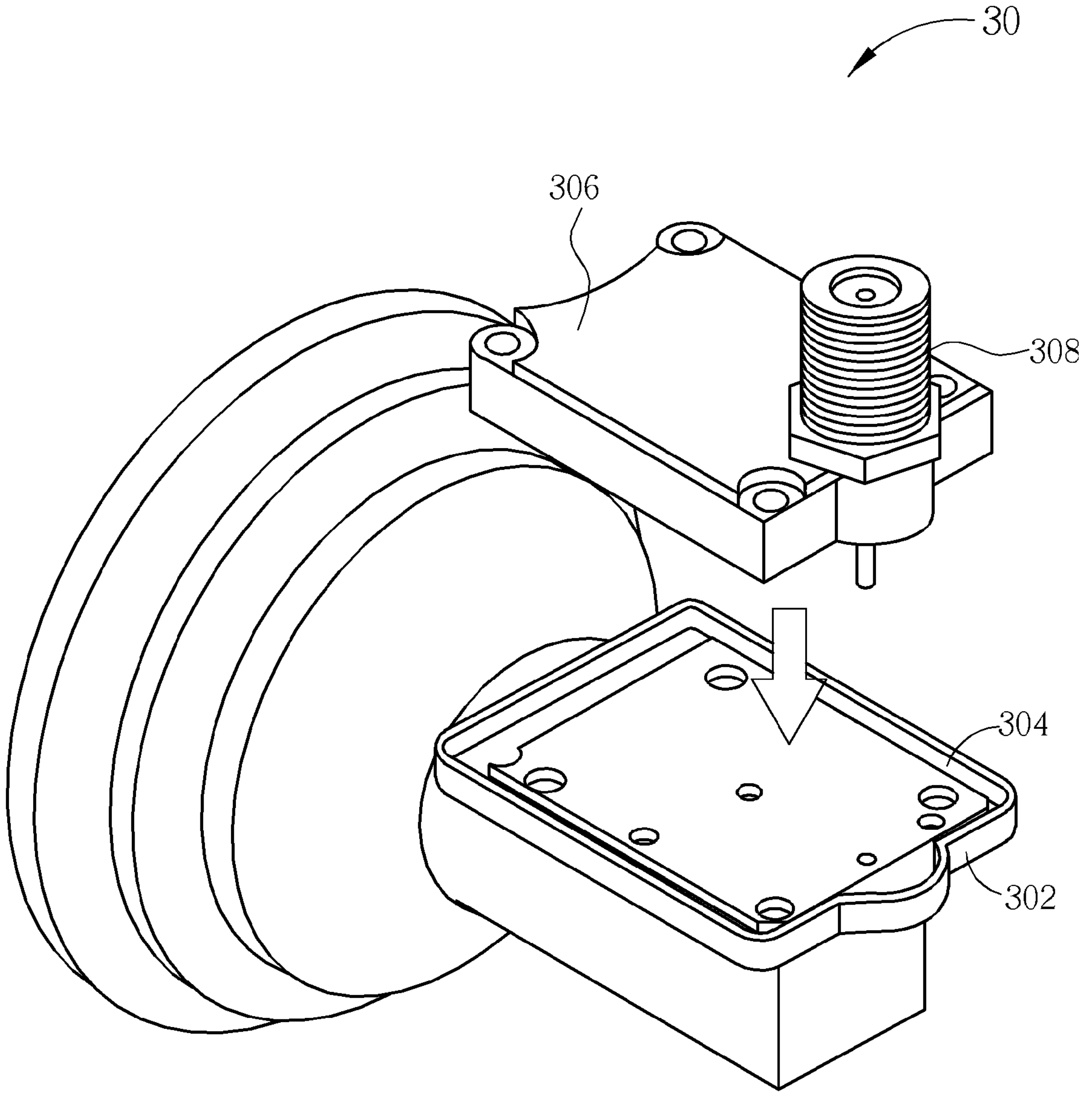
FIG. 7 is a schematic diagram of the LNBF during the assembly process according to another embodiment of the invention.

Please refer to FIG. 7, which is a schematic diagram of the LNBF 30 during the assembly process according to another embodiment of the invention. As shown in FIG. 7, the down-converter circuit board 304 can be fixed on the housing 302, and the F-connector 308 can be set on the spacer 306 in advance. Furthermore, the assembly item of the spacer 306 and the F-connector 308 can be installed on the housing 302. Besides, the down-converter circuit board 304 and the spacer 306 can also be disposed on the housing together based on the relationship shown in FIG. 3 of each component.

Note that, the LNBF 30 is an exemplary embodiment of the invention, and those skilled in the art can make alternations and modifications accordingly. For example, in the above-mentioned description and in the claims, the terms "fix" can be realized via any fixing method (such as lockup fastening, engaging, or gluing methods, etc.) which can prevent relative motion between one object and another object, and this should not be a limitation of the invention.

The F-connector 308 can be set on the spacer 306 by any fixing method, or the F-connector 308 and the spacer 306 can be monolithically formed. In addition, the down-converter circuit board 304 can be a printed circuit board.

In summary, the invention takes advantage of integrating the F-connector 308 and the spacer 306 so that the size of each component of the LNBF 30 is capable of being reduced with the minimized sized of the down-converter circuit board 304, reducing the size of the LNBF 30 effectively and reducing the manufacturing cost substantially.

Those skilled in the art will readily observe that numerous modifications and alterations of the device and method may be made while retaining the teachings of the invention.

What is claimed is:

1. A low noise block down-converter with integrated feed (LNBF), comprising:

a housing;

a spacer disposed on the housing, wherein a hole is formed on the spacer;

a down-converter circuit board disposed between the housing and the spacer; and an F-connector disposed on the spacer and electrically connected to the down-converter circuit board via the hole;

wherein the down-converter circuit board is fixed on a first side of the spacer, and the F-connector is disposed on a second side opposite the first side of the spacer.

2. The LNBF of claim 1, wherein after the down-converter circuit board and the F-connector are fixed on the first side of the spacer, an assembly of the down-converter circuit board, the F-connector, and the spacer is disposed on the housing.

3. The LNBF of claim 1, wherein the down-converter circuit board is a printed circuit board.

4. The LNBF of claim 1, wherein the F-connector comprises:

a connector body fixed on the spacer; and a conducting line connected to the down-converter circuit board via the hole for transmitting signal.

5. The LNBF of claim 4, wherein a diameter of the connector body is larger than a diameter of the hole of the spacer.

6. The LNBF of claim 4, wherein the connector body is disposed around the hole.

7. The LNBF of claim 1, wherein the F-connector and the spacer are monolithically formed.

8. The LNBF of claim 1, wherein the spacer, the down-converter circuit board, and the F-connector are disposed on the same side of the housing.

9. The LNBF of claim 1, wherein the spacer, the down-converter circuit board, and the F-connector are disposed on the housing by a lockup fastening method.

10. The LNBF of claim 1, wherein the spacer, the down-converter circuit board, and the F-connector are disposed on the housing by an engaging method.

11. The LNBF of claim 1, wherein the spacer, the down-converter circuit board, and the F-connector are disposed on the housing by a gluing method.

* * * * *